US011079804B2

(12) United States Patent
Zhu et al.

(10) Patent No.: US 11,079,804 B2
(45) Date of Patent: Aug. 3, 2021

(54) BACK PLATE STRUCTURE AND FLEXIBLE DISPLAY DEVICE

(71) Applicant: Yungu (Gu'an) Technology Co., Ltd., Langfang (CN)

(72) Inventors: Zhaoji Zhu, Langfang (CN); Liwei Ding, Langfang (CN); Fu Liao, Langfang (CN); Hongqi Hou, Langfang (CN); Liuyang Wang, Langfang (CN); Yongfeng Zhao, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 0 days.

(21) Appl. No.: 16/867,703

(22) Filed: May 6, 2020

(65) Prior Publication Data

US 2020/0264670 A1 Aug. 20, 2020

Related U.S. Application Data

(63) Continuation of application No. PCT/CN2019/072351, filed on Jan. 18, 2019.

(30) Foreign Application Priority Data

Sep. 19, 2018 (CN) .......................... 201821535732.0

(51) Int. Cl.
*G06F 1/16* (2006.01)
*G09F 9/30* (2006.01)
(Continued)

(52) U.S. Cl.
CPC .......... *G06F 1/1652* (2013.01); *G06F 1/1616* (2013.01); *G09F 9/301* (2013.01); *H05K 5/0017* (2013.01); *H05K 5/0217* (2013.01)

(58) Field of Classification Search
CPC .... G06F 1/1652; G06F 1/1616; G06F 1/1681; G06F 1/1641; G09F 9/301; H05K 5/0017;
(Continued)

(56) References Cited

U.S. PATENT DOCUMENTS

2012/0307423 A1* 12/2012 Bohn .................... G06F 1/1652
361/679.01
2016/0048169 A1* 2/2016 Yang .................... G06F 1/1652
361/749
(Continued)

FOREIGN PATENT DOCUMENTS

CN 104851365 A 8/2015
CN 205665971 U 10/2016
(Continued)

OTHER PUBLICATIONS

PCT International Search Report of PCT/CN2019/072351 dated Jun. 17, 2019 and English Translation.
PCT Written Opinion of PCT/CN2019/072351 dated Jun. 17, 2019.

*Primary Examiner* — Abhishek M Rathod
(74) *Attorney, Agent, or Firm* — Ladas & Parry LLP

(57) ABSTRACT

The present application provides a back plate structure and a flexible display device. The back plate structure includes: a first back plate, a second back plate and a flexible shaft. The first back plate and the second back plate are connected by the flexible shaft. The flexible shaft includes an arch component and at least one end component. The arch component includes a concave surface and a convex surface corresponding to the concave surface, and the concave surface faces a bending direction of the flexible display
(Continued)

device. Each end component includes at least one foldable structure, and each foldable structure includes two planes parallel to a bending axis of the flexible display device. Each end component is located at an end of the arch component and obscures a space formed by the arch component.

14 Claims, 17 Drawing Sheets

(51) Int. Cl.
*H05K 5/00* (2006.01)
*H05K 5/02* (2006.01)

(58) Field of Classification Search
CPC ....... H05K 5/0217; H01L 27/32; H01L 51/52; G02F 1/1333
See application file for complete search history.

(56) References Cited

U.S. PATENT DOCUMENTS

| | | | |
|---|---|---|---|
| 2016/0116944 A1* | 4/2016 | Lee | H04M 1/0216 |
| | | | 361/679.26 |
| 2016/0132075 A1* | 5/2016 | Tazbaz | G06F 1/1681 |
| | | | 361/679.27 |
| 2016/0195901 A1* | 7/2016 | Kauhaniemi | G06F 1/1681 |
| | | | 361/679.27 |
| 2016/0299532 A1* | 10/2016 | Gheorghiu | E05D 11/0054 |
| 2016/0324023 A1* | 11/2016 | Kim | G06F 1/1652 |
| 2018/0011515 A1* | 1/2018 | Yoo | G06F 1/1626 |
| 2018/0110139 A1* | 4/2018 | Seo | H04M 1/0216 |
| 2018/0373297 A1* | 12/2018 | Liao | G06F 1/1601 |

FOREIGN PATENT DOCUMENTS

| | | |
|---|---|---|
| CN | 106205383 A | 12/2016 |
| CN | 106919223 A | 7/2017 |
| CN | 107195253 A | 9/2017 |
| CN | 108230907 A | 6/2018 |

\* cited by examiner

BACK PLATE STRUCTURE AND FLEXIBLE DISPLAY DEVICE

CROSS-REFERENCE TO RELATED APPLICATIONS

The present application is a continuation of International Application No. PCT/CN2019/072351 filed on Jan. 18, 2019, which claims priority to Chinese patent application No. 201821535732.0, filed on Sep. 19, 2018. Both applications are incorporated herein by reference in their entireties.

TECHNICAL FIELD

The present application relates to the field of display, particularly to a back plate structure and a flexible display device.

BACKGROUND

Flexible display devices are widely used in our daily life and work, such as mobile phones, tablets, wearable devices, etc., because they are bendable, foldable, light, thin, and small. When the existing flexible display device is bent or folded, there is a phenomenon of stress concentration on a shaft structure of the flexible display device. In addition, it is difficult to bend or fold the flexible display device rapidly, as well as it is difficult to meet the requirements of the number of foldable times and service life.

SUMMARY

In view of this, embodiments of the present application provide a back plate structure and a flexible display device, which can realize rapid folding of the flexible display device, avoid bulge deformation during the folding process, and improve the service life of the flexible display device.

In an aspect of the present application, a back plate structure is provided, which includes: a first back plate, a second back plate and a flexible shaft. The first back plate and the second back plate are connected by the flexible shaft; the flexible shaft includes an arch component and at least one end component; the arch component includes a concave surface and a convex surface corresponding to the concave surface, and the concave surface faces a bending direction of the flexible display device; each end component is located at an end of the arch component and obscures a space formed by the arch component; and the end component includes at least one foldable structure, and each foldable structure includes two planes parallel to a bending axis of the flexible display device.

In some embodiments of the present application, the at least one foldable structure includes a plurality of V-shaped structures, the plurality of V-shaped structures are integrally formed end-to-end and are connected between the first back plate and the second back plate, and an opening of each V-shaped structure faces the bending direction of the flexible display device.

In some embodiments of the present application, the end component further includes a plurality of baffles located at troughs of the plurality of V-shaped structures respectively and connected between the plurality of V-shaped structures and the arch component.

In some embodiments of the present application, the end component further includes a partition, both ends of which are connected to the first back plate and the second back plate respectively; the at least one foldable structure includes a plurality of V-shaped structural layers, each V-shaped structural layer includes a plurality of V-shaped units, an opening of each V-shaped unit faces the first back plate or the second back plate; one end of the V-shaped unit is connected to an end surface of the arch component, and the other end of the V-shaped unit is connected to a surface of the partition adjacent to the arch component; the plurality of V-shaped structural layers are arranged in layers on the surface of the partition adjacent to the arch component, and V-shaped units in two adjacent V-shaped structural layers are alternately arranged.

In some embodiments of the present application, an opening angle of the V-shaped unit is between 60° and 150°.

In some embodiments of the present application, both ends of the end component are connected to the first back plate and the second back plate respectively; the end component further includes a plurality of herringbone units, an opening of each herringbone unit faces the arch component, and both ends of the opening of the herringbone unit are connected to an end surface of the arch component; the at least one foldable structure includes a plurality of V-shaped units, an opening of each V-shaped unit faces the bending direction of the flexible display device, and the plurality of V-shaped units are connected to the plurality of herringbone units at intervals.

In some embodiments of the present application, the end component further includes a partition, both ends of which are connected to the first back plate and the second back plate respectively; the at least one foldable structure includes a plurality of L-shaped units, and an opening of each L-shaped unit faces the first back plate or the second back plate; one end of the L-shaped unit is connected to the concave surface, and the other end of the L-shaped unit is connected to a surface of the partition adjacent to the arch component.

In some embodiments of the present application, the end component further includes a partition, both ends of which are connected to the first back plate and the second back plate respectively; the at least one foldable structure includes a plurality of V-shaped units, and an opening of each V-shaped unit faces the first back plate or the second back plate; one end of the V-shaped unit is connected to the concave surface, and the other end of the V-shaped unit is connected to a surface of the partition adjacent to the arch component.

In some embodiments of the present application, the end component further includes a first baffle and a second baffle, the end component is connected to the first back plate and the second back plate by the first baffle and the second baffle respectively, and the first baffle and the second baffle are respectively connected to the arch component.

In some embodiments of the present application, a thickness of the arch component is between 0.6 mm and 0.8 mm.

In some embodiments of the present application, a material of the flexible shaft includes at least one of rubber, inorganic silica gel, and thermoplastic elastomer.

In another aspect of the present application, a flexible display device is provided, which includes a back plate structure described above; and a display panel disposed on one side of the concave surface of the back plate structure.

In some embodiments of the present application, a vertical distance between the end component of the back plate structure and an end of the display panel is between 0.5 mm and 1 mm.

The embodiments of the present application provide a back plate structure and a flexible display device. By setting a flexible shaft as a combination of an arch component and an end component having a foldable structure, rapid folding of the flexible display device can be achieved, uplift deformation during the folding process can be avoided and the service life of the flexible display device can be improved.

DETAILED DESCRIPTION OF THE EMBODIMENTS

The technical solutions in the embodiments of the present application are clearly and completely described in the following with reference to the accompanying drawings in the embodiments of the present application. Obviously, the described embodiments are only a part of embodiments of the present application, not all embodiments. Based on the embodiments in the present application, all other embodiments obtained by a person skilled in the art without creative efforts shall fall within the protection scope of the present application.

Figure 1:
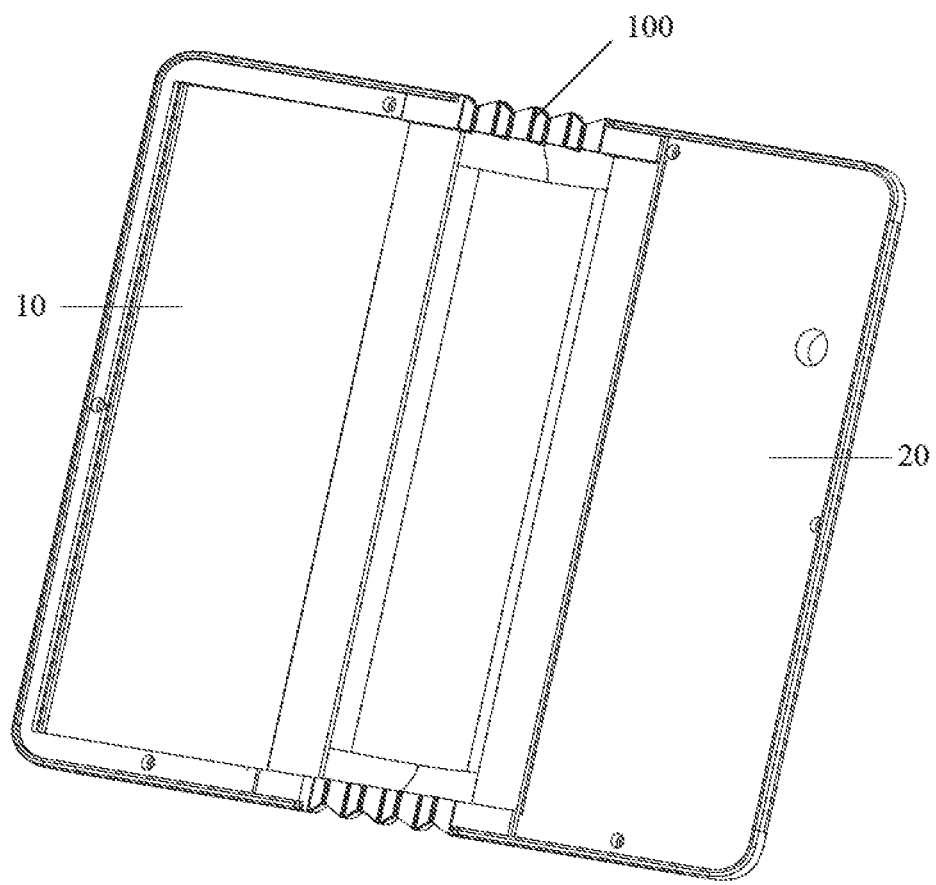
FIG. 1 is a schematic structural diagram illustrating a back plate structure according to an embodiment of the present application.

FIG. 1 is a schematic structural diagram illustrating a back plate structure according to an embodiment of the present application. The back plate structure may be used in a flexible display device. As shown in FIG. 1, the back plate structure includes a first back plate 10, a second back plate 20 and a flexible shaft 100.

The first back plate 10 and the second back plate 20 are connected by the flexible shaft 100. Referring to FIGS. 2a to 2h, the flexible shaft 100 includes an arch component 110 and at least one end component 120. The arch component 110 includes a concave surface 111 and a convex surface 112 corresponding to the concave surface 111. The concave surface 111 faces a bending direction of the flexible display device. Each end component 120 includes at least one foldable structure, and each foldable structure includes two planes parallel to a bending axis of the flexible display device. Each end component 120 is located at an end of the arch component 110 and obscures a space formed by the arch component 110.

Specifically, the back plate structure may be used in a flexible display device. The first back plate 10 and the second back plate 20 may support a display panel in the flexible display device. The flexible shaft 100 may serve as a rotating shaft to achieve bending or folding of the flexible display device.

The first back plate 10 and the second back plate 20 may be made of a metal or an alloy having a certain hardness, such as aluminum or stainless steel, so as to fix the display panel of the flexible display device.

When a flexible display device is bent or folded, the bent or folded portion of the display panel will protrude toward the space between the display panel and the back plate structure, that is, the display panel has a certain bending radius. If the bending radius is too large, friction and stress will be generated between the flexible shaft 100 of the back plate structure and the display panel, thereby causing wear on the display panel or the flexible shaft and reducing the service life of the display panel or the flexible shaft. Therefore, in this embodiment, the flexible shaft 100 is set in an arch shape to increase the space between the display panel and the flexible shaft 100.

Figure 2A:
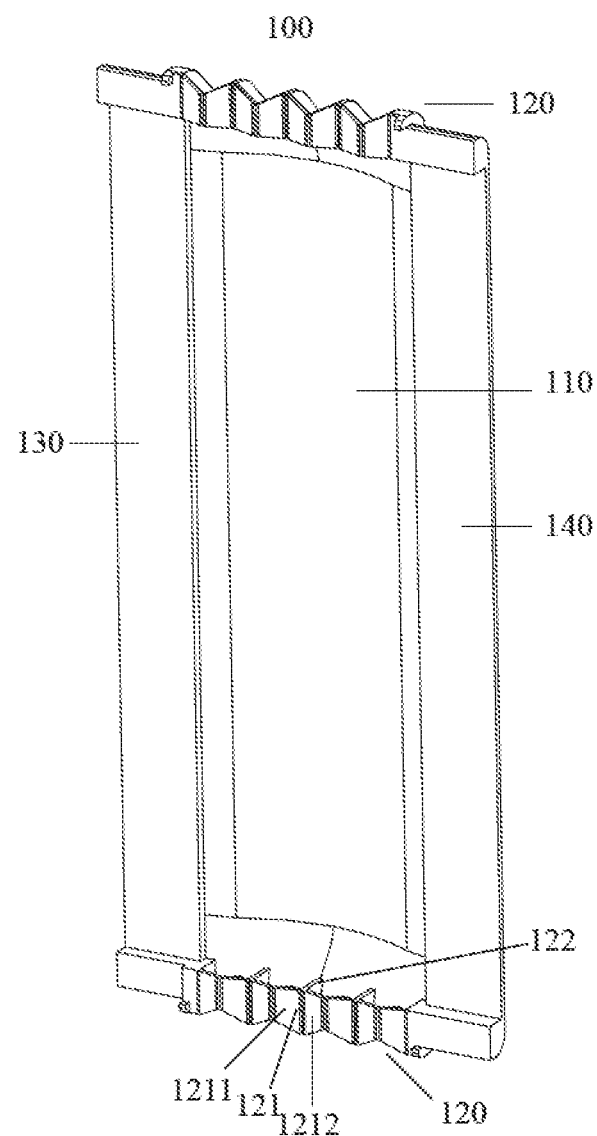
FIG. 2a is a schematic structural diagram illustrating a flexible shaft according to an embodiment of the present application.
Figure 2B:
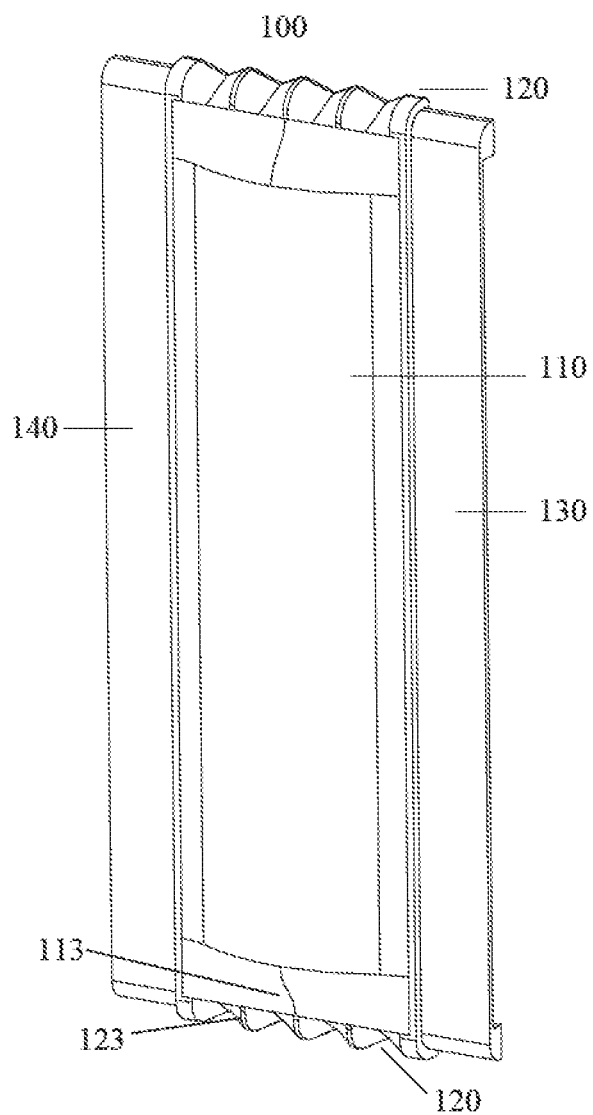
FIG. 2b is a schematic structural diagram illustrating a flexible shaft according to an embodiment of the present application.
Figure 2C:
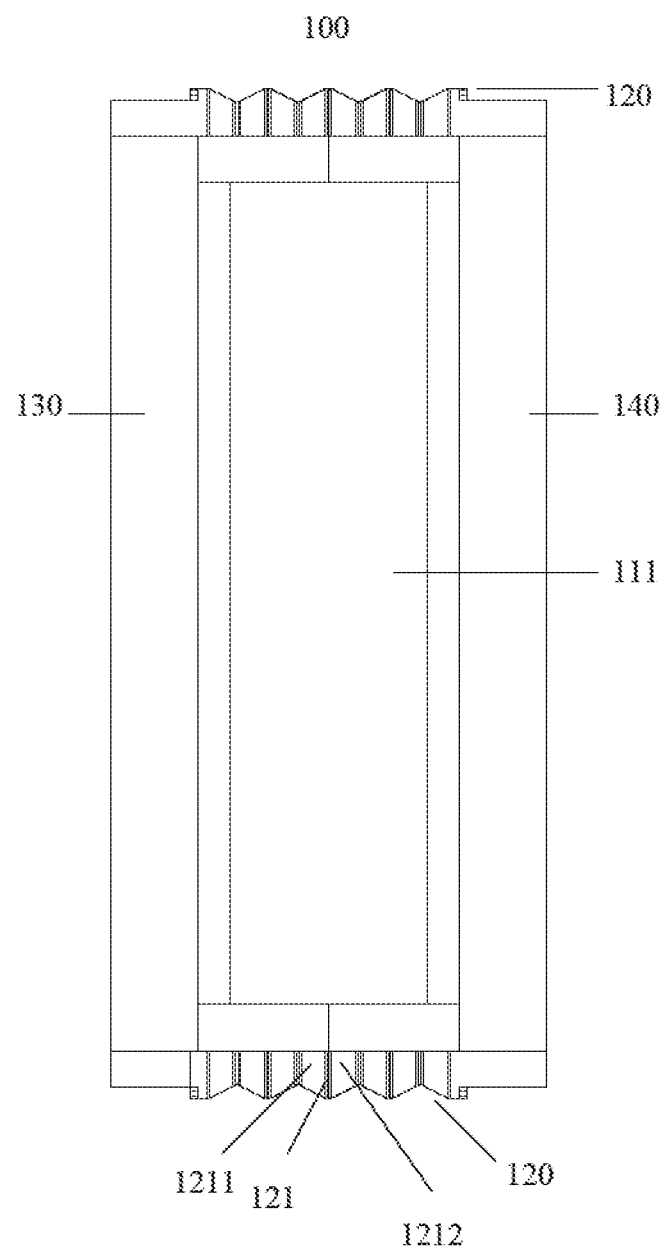
FIG. 2c is a front view illustrating a flexible shaft according to an embodiment of the present application.
Figure 2D:
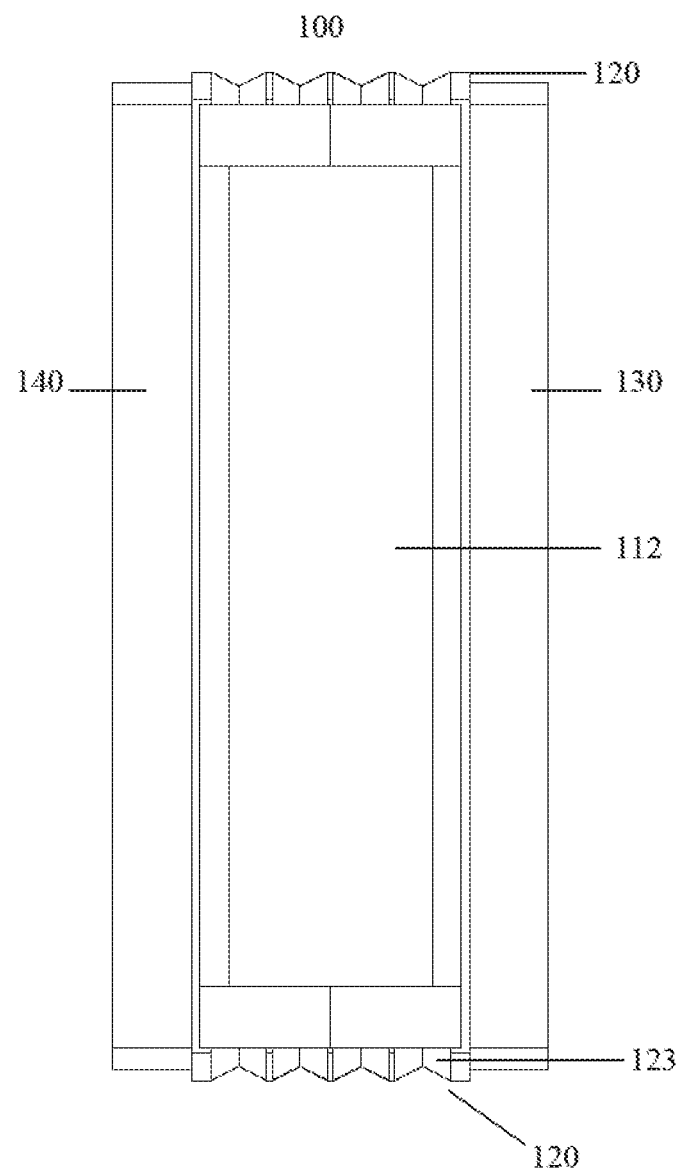
FIG. 2d is a rear view illustrating a flexible shaft according to an embodiment of the present application.
Figure 2E:
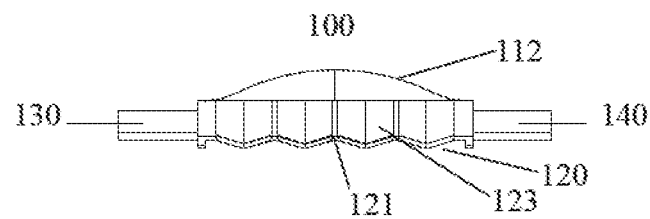
FIG. 2e is a top view illustrating a flexible shaft according to an embodiment of the present application.
Figure 2F:
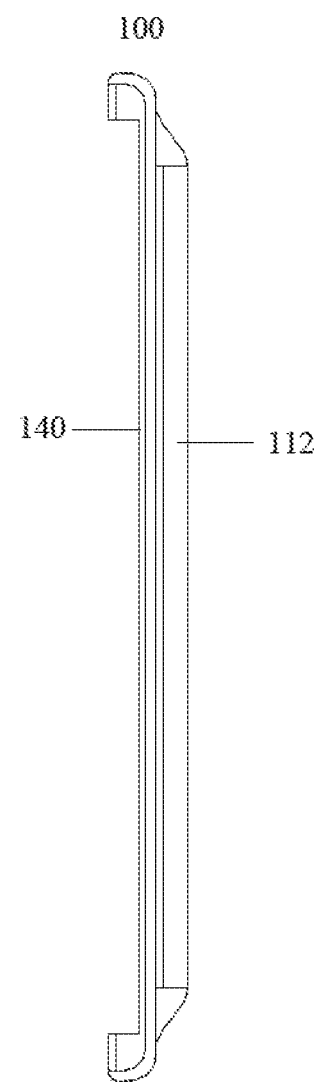
FIG. 2f is a right side view illustrating a flexible shaft according to an embodiment of the present application.

Referring to FIG. 2e, if the flexible shaft 100 is set in an arch shape, the space between the display panel and the flexible shaft 100 can be seen from below or above, which affects the aesthetics of the flexible display device. In order to solve this problem, the flexible shaft 100 may include an arch component 110 and an end component 120. The end component 120 and the arch component 110 may be made integrally or may be connected together by means of gluing or the like. The number of end components 120 may be one or two. If the number of the end components 120 is one, the end component 120 may be located at any end of the arch component 110; if the number of the end components 120 is two, the two end components 120 may be respectively located at the two ends of the arch component 110.

In order to avoid uplift deformation of the end component 120 due to compression during the bending or folding process, thereby affecting the appearance, the end component 120 may include a foldable structure. The foldable structure may include two planes parallel to the bending axis of the flexible display device. A certain angle may be formed between the two planes to achieve rapid folding, and the two planes may be recessed into the interior of the end component 120 during bending to avoid the uplift deformation of the end component 120. The specific number and shape of the foldable structure can be set according to actual needs.

In this embodiment, as shown in FIG. 2a to FIG. 2e, the flexible shaft 100 may further include side plates 130, 140. The side plates 130, 140 are respectively located on both sides of the arch component 110 and are parallel to the bending axis of the flexible shaft 100. The flexible shaft 100 may be connected to the first back plate 10 and the second back plate 20 by the two side plates 130, 140 respectively.

The embodiments of the present application provide a back plate structure. By setting a flexible shaft as a combination of an arch component and an end component having a foldable structure, rapid folding of the flexible display device can be achieved, uplift deformation during the folding process can be avoided and the service life of the flexible display device can be improved.

It should be understood that, for convenience of description, FIG. 1 shows an example of an end component of a back plate structure. The embodiments of the present application are not limited thereto.

According to an embodiment of the present application, as shown in FIG. 2a, FIG. 2c, FIG. 2e, FIG. 2g, and FIG. 2h, the at least one foldable structure includes a plurality of V-shaped structures 121, and the plurality of V-shaped structures 121 are integrally formed end-to-end and are connected between the first back plate 10 and the second back plate 20. An opening of each V-shaped structure 121 faces the bending direction of the flexible display device.

Figure 2G:
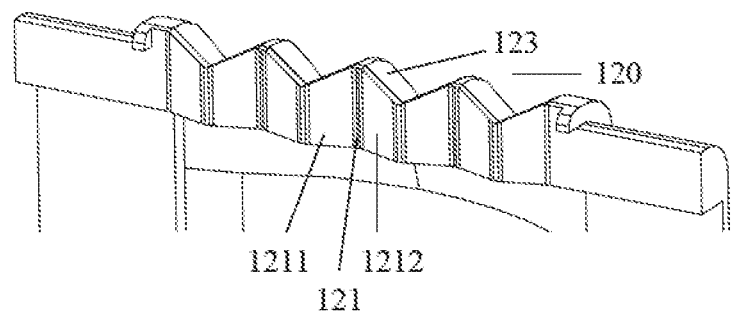
FIG. 2g is a schematic structural diagram illustrating an end component according to an embodiment of the present application.
Figure 2H:
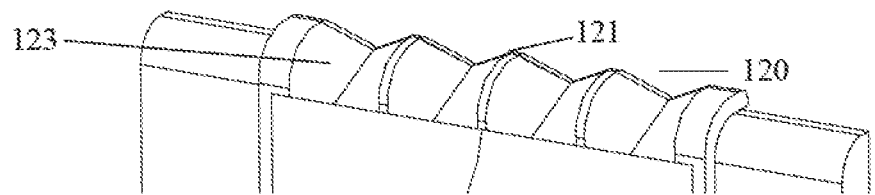
FIG. 2h is a schematic structural diagram illustrating an end component according to an embodiment of the present application.

Specifically, the V-shaped structure 121 (also can be referred to as a diamond-shaped surface) includes two side surfaces 1211, 1212, that is, two planes of the foldable structure mentioned above. The opening of the V-shaped structure 121 faces the display panel side of the flexible display device. The plurality of V-shaped structures 121 and the arch component 110 may be connected by a top surface 123, and the top surface 123 can obscure the space between the display panel and the flexible shaft 100. Further, the top surface 123 may be composed of a plurality of V-shaped sheets connected to each other, and the opening of the V-shaped sheet is upward, as shown in FIG. 2g. The top surface 123 is similar to a wave structure. The peaks of the top surface 123 correspond to the troughs of the V-shaped structures 121, which can further achieve rapid folding of the flexible shaft 100, and avoid the upward uplift deformation of the top surface 123 during the folding process. In order to reduce wear at corners, there may be transition fillets at the connection between the top surface 123, the V-shaped structures 121 and the arch component 110. As shown in FIG. 2b, the arch component 110 and the end component 120 may be connected by an arc transition surface 113.

The space enclosed by the plurality of V-shaped structures 121 and the arch component 110 may be hollow, so that during the folding process, the plurality of V-shaped structures 121 and the top surface 123 may be recessed into the space at the respective troughs to avoid outward uplift.

In this embodiment, as shown in FIG. 2a, the end component 120 further includes a plurality of baffles 122. The plurality of baffles 122 are respectively located at the troughs of the plurality of V-shaped structures 121, and connected between the plurality of the V-shaped structures 121 and the arch component 110.

Specifically, the trough of the V-shaped structure 121 is provided with a baffle 122, and the baffle 122 may be parallel to the bending axis of the flexible display device and perpendicular to a flattened (unbent or unfolded) plane of the display panel. The baffle 122 can support the V-shaped structure 121 and make it convenient to fold and unfold the V-shaped structure 121.

According to an embodiment of the present application, a thickness of the arch component 110 is between 0.6 mm and 0.8 mm.

Specifically, in order to further increase the space between the display panel and the flexible shaft 100, the thickness of the arch component 110 should be reduced as much as possible. However, if the thickness of the arch component 110 is too thin, the strength and the structural stability of the arch component 110 may be reduced. Therefore, in this embodiment, the thickness of the arch component 110 may be 0.6 mm, 0.7 mm, or 0.8 mm. Obviously, the specific thickness of the arch component 110 can be determined according to the actual needs, which is not limited in the present application.

According to an embodiment of the present application, a material of the flexible shaft 100 may include any one of rubber, inorganic silica gel, and thermoplastic elastomer.

Specifically, in order to make it easy to fold the flexible shaft 100 and restore the flexible shaft 100 to its original shape when it is flattened, the material of the flexible shaft 100 may be organic silica gel, inorganic silica gel, other types of rubber, or thermoplastic elastomer. Of course, the specific material of the flexible shaft 100 can be set according to the actual situation, which is not limited in the present application.

Figure 3A:
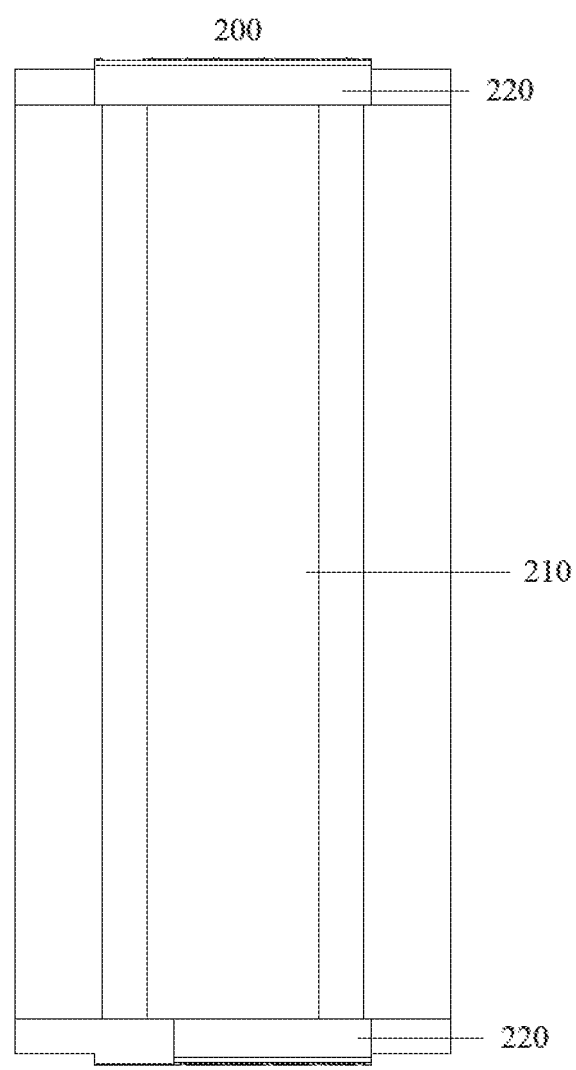
FIG. 3a is a front view illustrating a flexible shaft according to another embodiment of the present application.
Figure 3B:
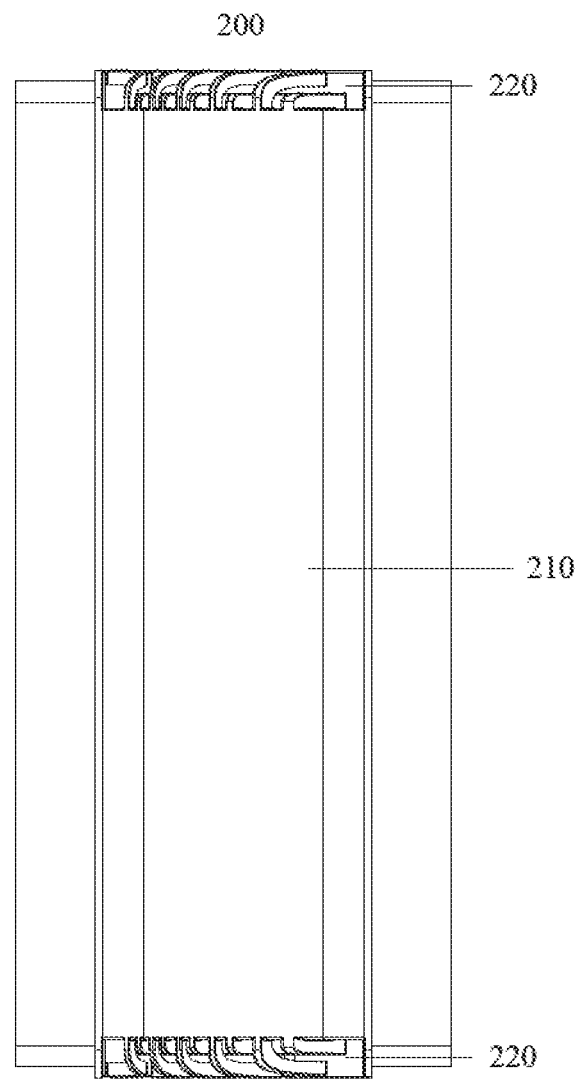
FIG. 3b is a rear view illustrating a flexible shaft according to another embodiment of the present application.
Figure 3C:
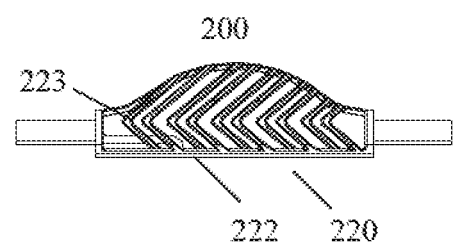
FIG. 3c is a top view illustrating a flexible shaft according to another embodiment of the present application.
Figure 3D:
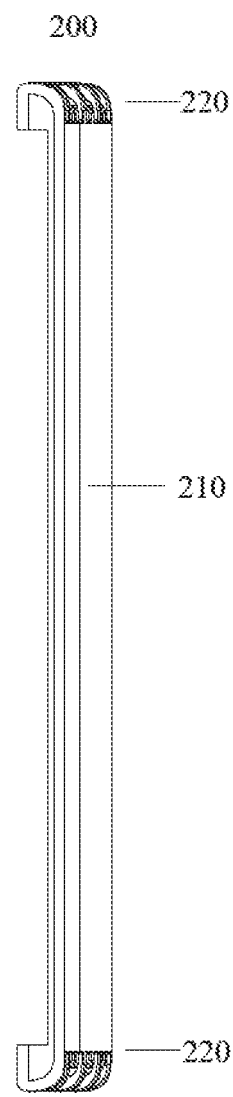
FIG. 3d is a right side view illustrating a flexible shaft according to another embodiment of the present application.
Figure 3E:
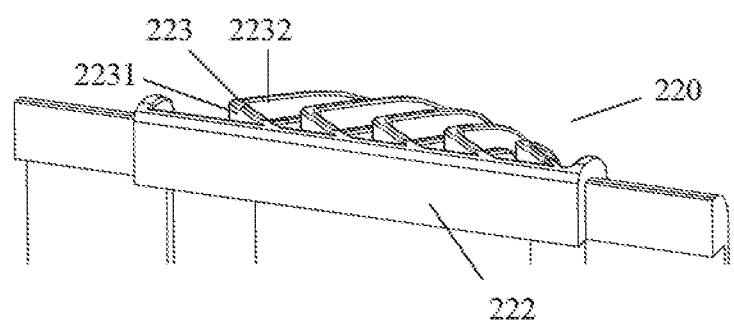
FIG. 3e is a schematic structural diagram illustrating an end component according to another embodiment of the present application.
Figure 3F:
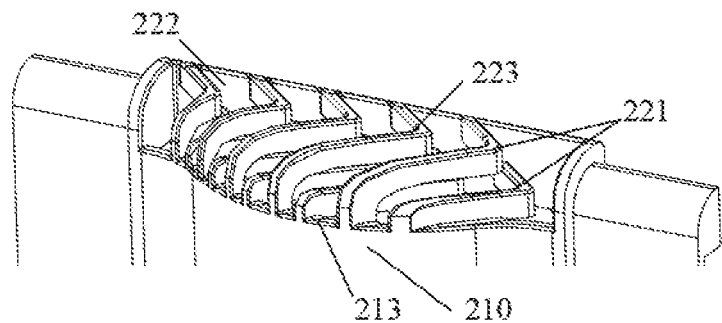
FIG. 3f is a schematic structural diagram illustrating an end component according to another embodiment of the present application.

FIG. 3a is a front view illustrating a flexible shaft 200 according to another embodiment of the present application. The flexible shaft 200 is similar to the flexible shaft 100. Only the differences between them are described here, and the similarities are not described herein. As shown in FIG. 3b, the flexible shaft 200 includes an arch component 210 and two end components 220. Referring to FIGS. 3a to 3f, in addition to at least one foldable structure, the end component 220 further includes a partition 222, and both ends of which are respectively connected to the first back plate 10 and the second back plate 20. The at least one foldable structure includes a plurality of V-shaped structural layers 221, each V-shaped structural layers 221 includes a plurality of V-shaped units 223, and an opening of each V-shaped unit 223 faces the first back plate 10 or the second back plate 20. One end of the V-shaped unit 223 is connected to an end surface 213 of the arch component 210, and the other end of the V-shaped unit 223 is connected to a surface of the partition 222 adjacent to the arch component 210. The plurality of V-shaped structural layers 221 are arranged in layers on the surface of the partition 222 adjacent to the arch component 210, and V-shaped units 223 in two adjacent V-shaped structural layers 221 are alternately arranged.

Specifically, the V-shaped unit 223 includes two side sheets 2231, 2232, that is, two planes of the foldable structure mentioned above. The opening of the V-shaped unit 223 faces the first back plate 10 or the second back plate 20, and a hollowed-out structure composed of the plurality of V-shaped units 223 is disposed above the arch component 210. A connecting line between the two side sheets 2231, 2232 may be parallel or roughly parallel to the bending axis of the flexible display device. Therefore, during the folding process, one side of the V-shaped unit 223 is squeezed by the partition 222, and the other side of the V-shaped unit 223 is squeezed by the arch component 210, so that the V-shaped unit 223 is slowly closed. When the first back plate 10 is folded to the position of the second back plate 20, that is, the first back plate 10 is folded to 180 degrees, the two side sheets 2231, 2232 of the V-shaped unit 223 are closed, which can avoid the uplift deformation of the end component 220 and ensure the aesthetics of the appearance.

The V-shaped units 223 in two adjacent V-shaped structural layers 221 are arranged alternately, which can make the V-shaped structural layers 221 better obscure the space between the display panel and the flexible shaft 200, and can make the plurality of V-shaped units 223 be stressed uniformly to ensure the stability of the structure.

The number of layers of the V-shaped structural layers 221 can be set according to the actual needs. In this embodiment, the number of layers of the V-shaped structural layers 221 is two.

In this embodiment, an opening angle of the V-shaped unit 223 may be in a range of 0° and 180°, and preferably, the opening angle is between 60° and 150°.

Specifically, the opening angle of the V-shaped unit 223 may be, but is not limited to, 60°, 70°, 80°, 90°, 100°, 110°, 120°, 130°, 140°, and 150°. The specific opening angle of the V-shaped unit 223 can be set according to the actual needs.

Since the positions of each V-shaped unit 223 on the end surface 213 of the arch component 210 are different, the sizes of each V-shaped unit 223 can be different and can be determined according to the actual spatial position. For example, the size of the V-shaped unit 223 near the middle of the arch component 210 is larger than the size of the V-shaped unit 223 near the edge of the arch component 210. The specific number of the V-shaped units 223 can also be determined according to the actual spatial position.

The opening angles of each V-shaped unit 223 can be the same or different, and can be set according to the actual spatial position. For example, the opening angle of the V-shaped unit 223 near the middle of the arch component 210 is larger than the opening angle of the V-shaped unit 223 near the edge of the arch component 210.

Figure 4A:
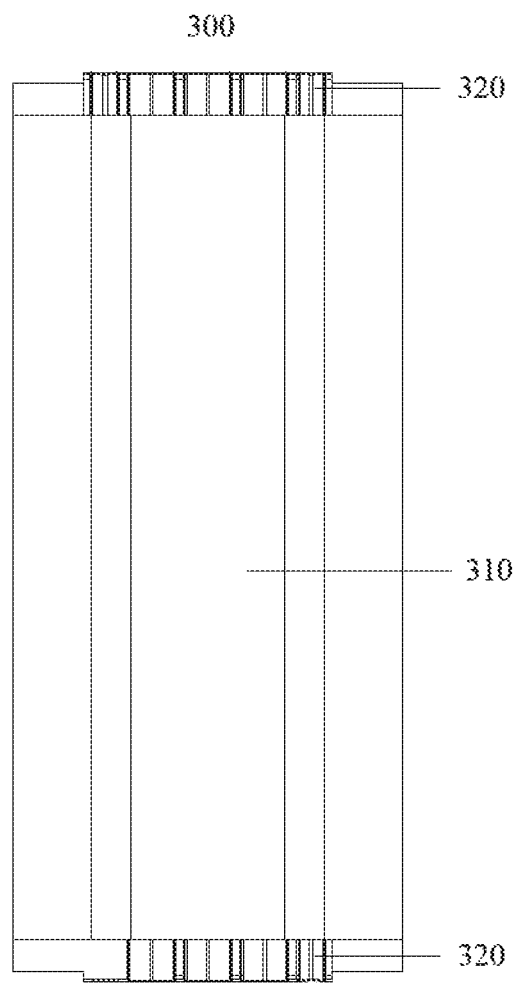
FIG. 4a is a front view illustrating a flexible shaft according to another embodiment of the present application.
Figure 4B:
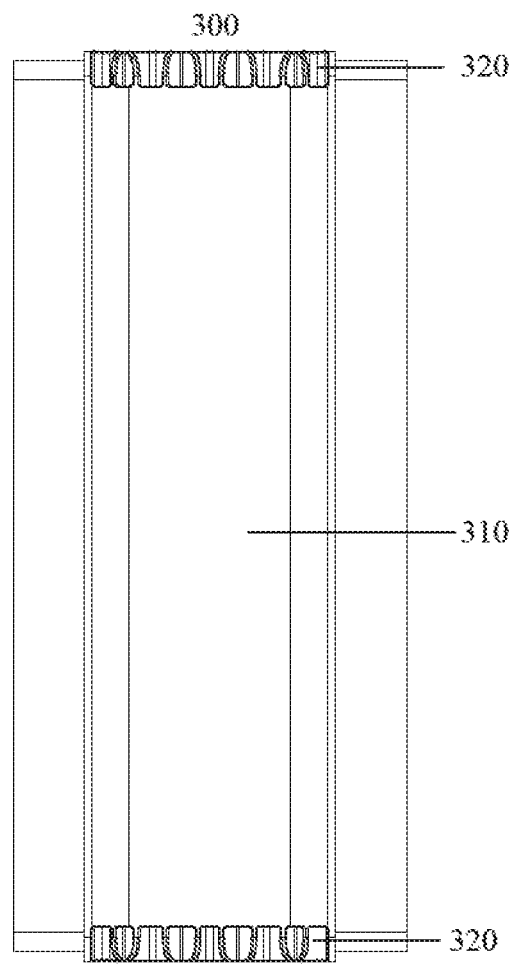
FIG. 4b is a rear view illustrating a flexible shaft according to another embodiment of the present application.
Figure 4C:
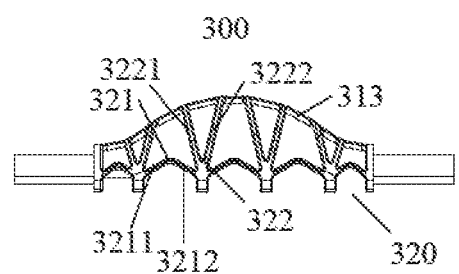
FIG. 4c is a top view illustrating a flexible shaft according to another embodiment of the present application.
Figure 4D:
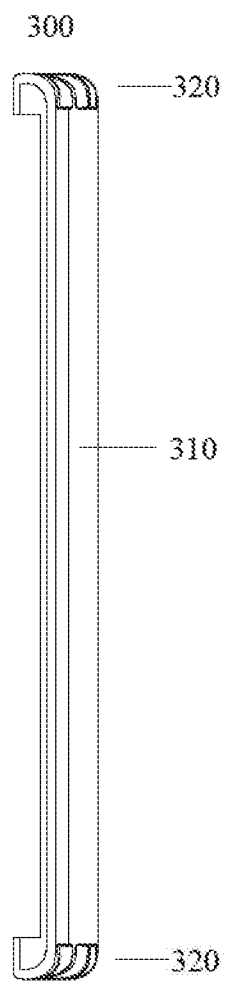
FIG. 4d is a right side view illustrating a flexible shaft according to another embodiment of the present application.
Figure 4E:
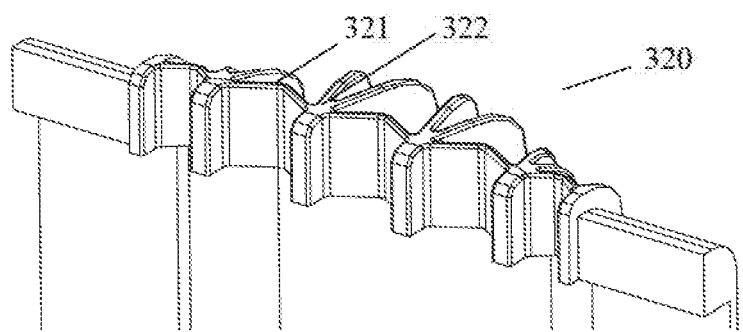
FIG. 4e is a schematic structural diagram illustrating an end component according to another embodiment of the present application.
Figure 4F:
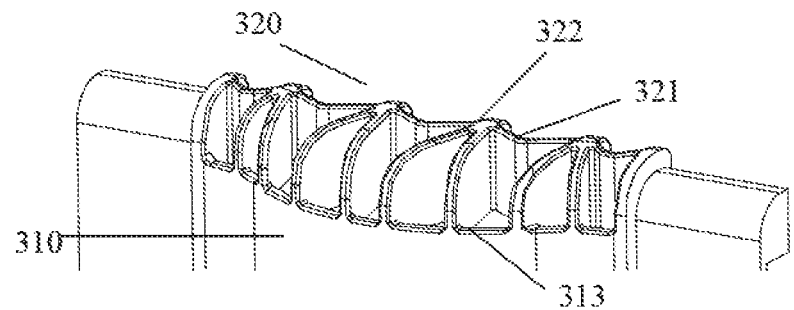
FIG. 4f is a schematic structural diagram illustrating an end component according to another embodiment of the present application.

FIG. 4a is a front view illustrating a flexible shaft 300 according to another embodiment of the present application. The flexible shaft 300 is similar to the flexible shaft 100. Only the differences between them are described here, and the similarities are not described herein. As shown in FIG. 4b, the flexible shaft 300 includes an arch component 310 and two end components 320. Referring to FIGS. 4a to 4f, two ends of the end component 320 are respectively connected to the first back plate 10 and the second back plate 20. In addition to the at least one foldable structure, the end component 320 further includes a plurality of herringbone units 322. An opening of each herringbone unit 322 faces the arch component 310, and both ends of the opening of the herringbone unit 322 are connected to an end surface 313 of the arch component 310. The at least one foldable structure includes a plurality of V-shaped units 321, and an opening of each V-shaped unit 321 faces the bending direction of the flexible display device. The plurality of V-shaped units 321 are connected to the plurality of herringbone units 322 at intervals.

Specifically, the V-shaped unit 321 includes two side sheets 3211, 3212, that is, two planes of the foldable structure mentioned above. The opening of the V-shaped unit 321 faces the display panel of the flexible display device. The herringbone unit 322 includes two side sheets 3221, 3222, and the opening of the herringbone unit 322 faces the arch component 310. Above the arch component 310 is a hollow structure composed of the plurality of V-shaped units 321 and the plurality of herringbone units 322. Therefore, during the folding process, the two side sheets 3211, 3212 of the V-shaped unit 321 will be slowly closed, and the two side sheets 3221, 3222 of the herringbone unit 322 will be slowly opened. When the first back plate 10 is folded to the position of the second back plate 20, that is, the first back plate 10 is folded to 180 degrees, the two side sheets 3211, 3212 of the V-shaped unit 321 can be closed to avoid the uplift deformation of the end component 320 and ensure the aesthetics of the appearance.

There may be one herringbone unit 322 or more than one herringbone units 322 between two adjacent V-shaped units 321. When a herringbone unit 322 is connected between two adjacent V-shaped units 321, the end component 320 may be stressed uniformly during the folding process, and the contraction effect is better.

Since the positions of each V-shaped unit 321 on the end surface 313 of the arch component 310 are different, the sizes of each V-shaped unit 321 may be different and can be determined according to the actual spatial position. For example, the size of the V-shaped unit 321 near the middle of the arch component 310 is larger than the size of the V-shaped unit 321 near the edge of the arch component 310. Similarly, since the positions of each herringbone unit 322 on the end surface 313 of the arch component 310 are different, the sizes of each herringbone unit 322 may be different and can be determined according to the actual spatial position. For example, the size of the herringbone unit 322 near the middle of the arch component 310 is larger than the size of the herringbone unit 322 near the edge of the arch component 310. The specific numbers of the V-shaped units 321 and the herringbone units 322 can also be determined according to the actual spatial position. The opening angle of the V-shaped unit 321 may be found in the opening angle of the V-shaped unit 223 described above.

Figure 5A:
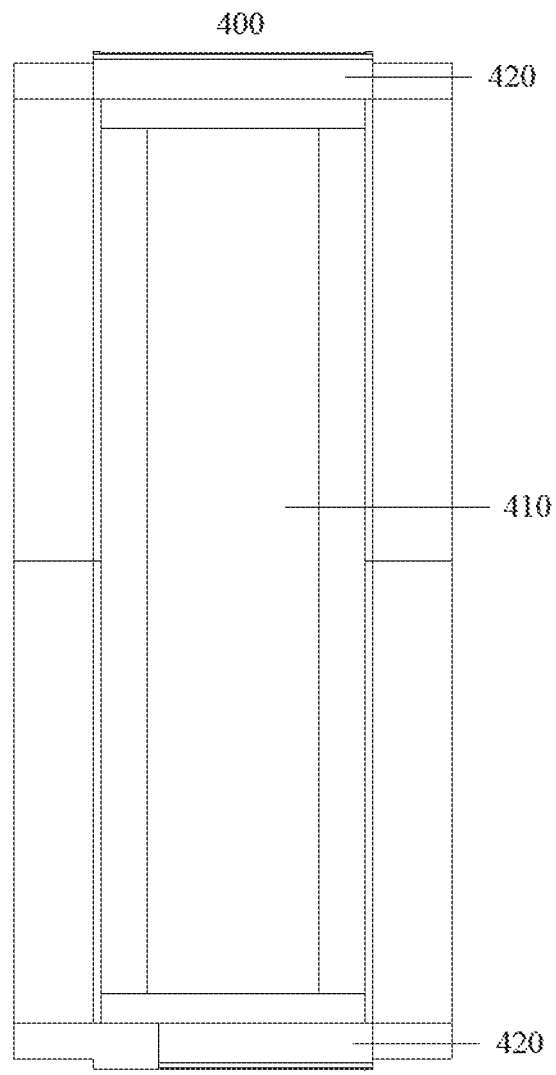
FIG. 5a is a front view illustrating a flexible shaft according to another embodiment of the present application.
Figure 5B:
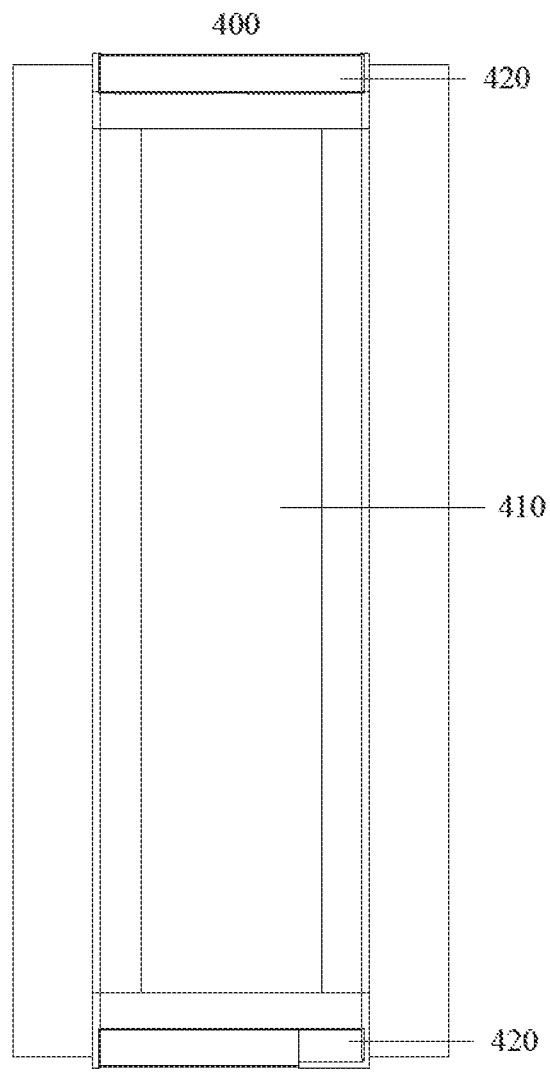
FIG. 5b is a rear view illustrating a flexible shaft according to another embodiment of the present application.
Figure 5C:
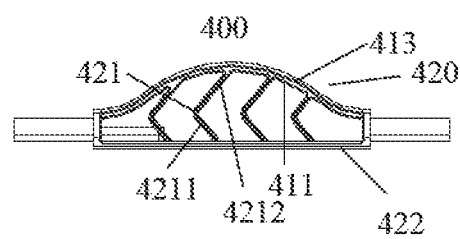
FIG. 5c is a top view illustrating a flexible shaft according to another embodiment of the present application.
Figure 5D:
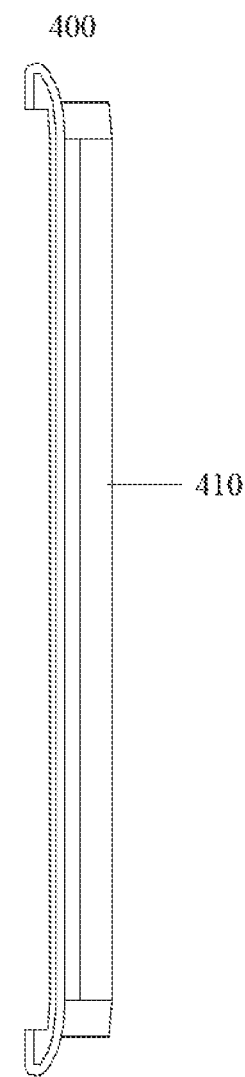
FIG. 5d is a right side view illustrating a flexible shaft according to another embodiment of the present application.
Figure 5E:
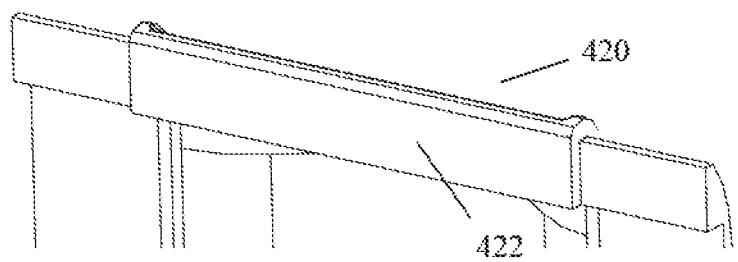
FIG. 5e is schematic structural diagram illustrating an end component according to another embodiment of the present application.

FIG. 5a is a front view illustrating a flexible shaft 400 according to another embodiment of the present application. The flexible shaft 400 is similar to the flexible shaft 100. Only the differences between them are described here, and the similarities are not described herein. As shown in FIG. 5a, the flexible shaft 400 includes an arch component 410 and two end components 420. Referring to FIGS. 5a to 5f, in addition to at least one foldable structure, the end component 420 further includes a partition 422. Both ends of the partition 422 are respectively connected to the first back plate 10 and the second back plate 20. The at least one foldable structure includes a plurality of L-shaped units 421, and an opening of each L-shaped unit 421 faces the first back plate 10 or the second back plate 20. One end of the L-shaped unit 421 is connected to the concave surface 411, and the other end is connected to a surface of the partition 422 adjacent to the arch component 410.

Specifically, the L-shaped unit 421 includes two side sheets 4211, 4212, that is, two planes of the foldable structure mentioned above. The opening of the L-shaped unit 421 faces the first back plate 10 or the second back plate 20. There is a hollowed-out structure composed of the plurality of L-shaped structures 421 between the arch component 410 and the partition 422, that is, the height of the L-shaped unit 421 may be lower than or equal to the height of the end surface 413 of the arch component 410. In this embodiment, a part above the arch component 410 may be empty, which can further avoid the uplift deformation of the end component 420 during the folding process and ensure the aesthetics of the appearance. The lengths of the two side sheets 4211, 4212 of the L-shaped unit 421 may be the same or different. When the lengths are different, the side sheet connected to the concave surface 411 may be the longer one or the shorter one.

A connecting line between the two side sheets 4211, 4212 of the L-shaped unit 421 may be parallel or roughly parallel to the bending axis of the flexible display device. Therefore, during the folding process, one side of the L-shaped unit 421 is squeezed backward by the partition 422, and the other side of the L-shaped unit 421 is squeezed forward by the concave surface 411, so that the L-shaped unit 421 is slowly closed. When the first back plate 10 is folded to the position of the second back plate 20, that is, the first back plate 10 is folded to 180 degrees, the two side sheets 4211, 4212 of the L-shaped unit 421 are closed, which can avoid the uplift deformation of the end component 420 and ensure the aesthetics of the appearance.

Since the positions of each L-shaped unit 421 between the partition 422 and the arch component 410 are different, the sizes of each L-shaped unit 421 may be different and can be determined according to the actual spatial position. For example, the size of the L-shaped unit 421 near the middle of the arch component 410 is larger than the size of the L-shaped unit 421 near the edge of the arch component 410. The specific number of the L-shaped units 421 can be determined according to the actual spatial position.

In this embodiment, the L-shaped units can be replaced by V-shaped units mentioned above. The opening of each V-shaped unit faces the first back plate 10 or the second back plate 20. One end of the V-shaped unit is connected to the concave surface 411, and the other end is connected to the surface of the partition 422 near the arch component 410.

Specifically, the opening angles of each V-shaped unit may be the same or different, and can be determined according to the actual needs. For example, the opening angle of the V-shaped unit near the middle of the arch component 410 is larger than the opening angle of the V-shaped unit near the edge of the arch component 410. The opening angle of the V-shaped unit may be found in the opening angle of the V-shaped unit 223 described above.

Figure 5F:
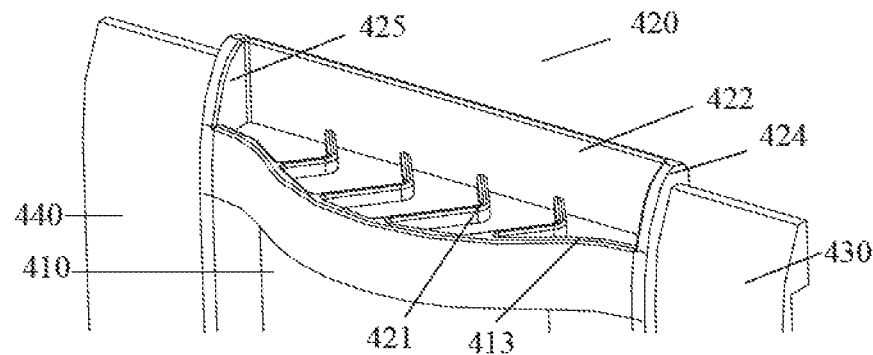
FIG. 5f is schematic structural diagram illustrating an end component according to another embodiment of the present application.

An end component (120, 220, 320, or 420) can be connected to the first back plate 10 and the second back plate 20 respectively by two side plates (see the description of the side plates 130, 140 mentioned above) of the flexible shaft. Further, according to an embodiment of the present application, the end component (120, 220, 320, or 420) further includes a first baffle and a second baffle. Taking the end component 420 as an example, as shown in FIG. 5f, the first baffle 424 is disposed between the arch component 410 and the side plate 430, the second baffle 425 is disposed between the arch component 410 and the side plate 440. The end component is connected to the first back plate 10 and the second back plate 20 respectively by the first baffle 424 and the second baffle 425. The first baffle 424 and the second baffle 425 are respectively connected to the arch component 410.

Specifically, by setting the first baffle and the second baffle, it is realized to connect the end component (120, 220, 320, or 420) respectively to the first back plate 10 and the second back plate 20, and it is also realized to connect the end component (120, 220, 320, or 420) to the arch component (110, 210, 310, or 410). Since the first baffle and the second baffle can increase the contact area between the connected components, the connection between various parts of the flexible shaft can be stronger, the stress can be more uniform, and the structural stability of the flexible shaft can be improved.

Figure 6A:
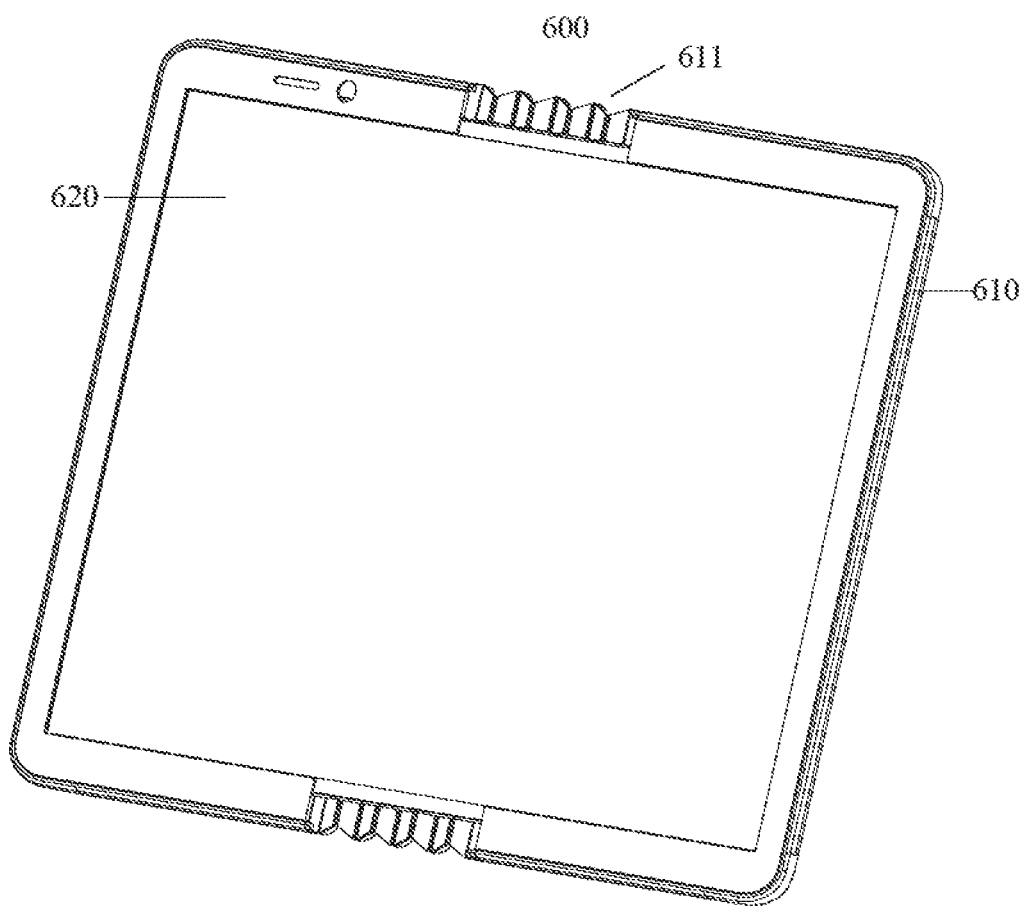
FIG. 6a is a schematic structural diagram illustrating a flexible display device according to an embodiment of the present application.

FIG. 6a is a schematic structural diagram illustrating a flexible display device 600 according to an embodiment of the present application. As shown in FIG. 6a, the flexible display device 600 includes the back plate structure 610 mentioned in above embodiments and a display panel 620. The display panel 620 is disposed on one side of the concave surface of the back plate structure 610.

Specifically, for the specific structure of the back plate structure 610, reference may be made to the description in the foregoing embodiments, and details are not described herein again. The flexible display device 600 may be any product or component having a display function, such as a mobile phone, a computer, a navigator, or a television.

The embodiments of the present application provide a flexible display device. By setting a flexible shaft as a combination of an arch component and an end component having a foldable structure, rapid folding of the flexible display device can be achieved, uplift deformation during the folding process can be avoided and the service life of the flexible display device can be improved.

Figure 6B:
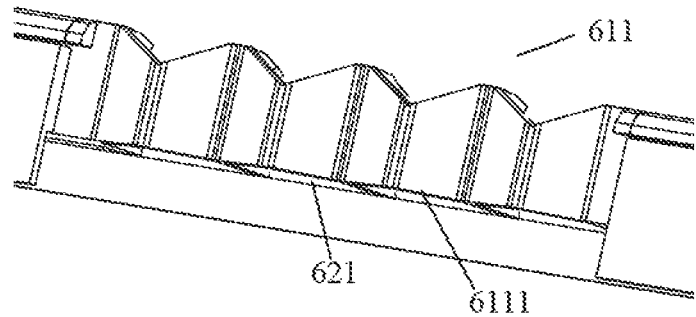
FIG. 6b is a schematic partial structural diagram illustrating a flexible display device according to an embodiment of the present application.

FIG. 6b is an enlarged schematic diagram illustrating a partial structure of the flexible display device 600 shown in the FIG. 6a. As shown in FIG. 6b, a vertical distance between the end component 611 of the back plate structure 610 and an end of the display panel 620 is between 0.5 mm and 1 mm.

Specifically, for the specific structure of the end component 611, reference may be made to the end component (120, 220, 320, or 420) shown in the foregoing embodiments, and details are not described herein again. In order to prevent the display panel 620 from being damaged due to friction between the end of the display panel 620 and the end component 611 during the bending or folding of the flexible display device 600, the vertical distance between a bottom edge 6111 of the end component 611 (a bottom edge of the V-shaped units 121, a bottom edge of the partition 222, a bottom edge of the V-shaped units 321 and the herringbone units 322, or a bottom edge of the partition 422) and the end (an end surface 621) of the display panel 620 may be, but not limited to, 0.5 mm, 0.6 mm, 0.7 mm, 0.8 mm, 0.9 mm or 1 mm. The specific height of the bottom edge 6111 of the end component 611 can be determined according to the actual needs.

The above are only preferred embodiments of the present application, and not intended to limit the present application. Any modification, equivalent replacement, etc. within the spirit and principle of the present application shall fall into the protection scope of the present application.

What is claimed is:
1. A back plate structure, used in a flexible display device, comprising:

a first back plate;
a second back plate; and
a flexible shaft, wherein,
the first back plate and the second back plate are connected by the flexible shaft;
the flexible shaft comprises an arch component and at least one end component;
the arch component comprises a concave surface and a convex surface corresponding to the concave surface, and the concave surface faces a bending direction of the flexible display device;
each end component is located at an end of the arch component and obscures a space formed by the arch component; and
the end component comprises at least one foldable structure, and each foldable structure comprises two planes parallel to a bending axis of the flexible display device;
wherein the end component further comprises a partition, both ends of which are connected to the first back plate and the second back plate respectively;
the at least one foldable structure comprises a plurality of V-shaped structural layers, each V-shaped structural layer comprises a plurality of V-shaped units, an opening of each V-shaped unit faces the first back plate or the second back plate;
one end of the V-shaped unit is connected to an end surface of the arch component, and the other end of the V-shaped unit is connected to a surface of the partition adjacent to the arch component;
the plurality of V-shaped structural layers are arranged in layers on the surface of the partition adjacent to the arch component, and V-shaped units in two adjacent V-shaped structural layers are alternately arranged.

2. The back plate structure according to claim 1, wherein the plurality of V-shaped structures are integrally formed end-to-end and are connected between the first back plate and the second back plate, and the opening of each V-shaped structure faces the bending direction of the flexible display device.

3. The back plate structure according to claim 2, wherein the end component further comprises a plurality of baffles located at troughs of the plurality of V-shaped structures respectively and connected between the plurality of V-shaped structures and the arch component.

4. The back plate structure according to claim 2, wherein the end component further comprises a first baffle and a second baffle, the end component is connected to the first back plate and the second back plate by the first baffle and the second baffle respectively, and the first baffle and the second baffle are respectively connected to the arch component.

5. The back plate structure according to claim 2, wherein a thickness of the arch component is between 0.6 mm and 0.8 mm.

6. The back plate structure according to claim 2, wherein a material of the flexible shaft comprises at least one of rubber, inorganic silica gel, and thermoplastic elastomer.

7. The back plate structure according to claim 1, wherein an opening angle of the V-shaped unit is between 60° and 150°.

8. The back plate structure according to claim 1, wherein the end component further comprises a plurality of herringbone units, an opening of each herringbone unit faces the arch component, and both ends of the opening of the herringbone unit are connected to an end surface of the arch component;
the opening of each V-shaped unit faces the bending direction of the flexible display device, and the plurality of V-shaped units are connected to the plurality of herringbone units at intervals.

9. The back plate structure according to claim 6, wherein the end component further comprises a first baffle and a second baffle, the end component is connected to the first back plate and the second back plate by the first baffle and the second baffle respectively, and the first baffle and the second baffle are respectively connected to the arch component.

10. The back plate structure according to claim 6, wherein a thickness of the arch component is between 0.6 mm and 0.8 mm.

11. The back plate structure according to claim 1, wherein the end component further comprises a first baffle and a second baffle, the end component is connected to the first back plate and the second back plate by the first baffle and the second baffle respectively, and the first baffle and the second baffle are respectively connected to the arch component.

12. The back plate structure according to claim 1, wherein a thickness of the arch component is between 0.6 mm and 0.8 mm.

13. A flexible display device, comprising:
a back plate structure comprising a first back plate, a second back plate and a flexible shaft, wherein, the first back plate and the second back plate are connected by the flexible shaft;
the flexible shaft comprises an arch component and at least one end component;
the arch component comprises a concave surface and a convex surface corresponding to the concave surface, and the concave surface faces a bending direction of the flexible display device;
each end component is located at an end of the arch component and obscures a space formed by the arch component; and
the end component comprises at least one foldable structure, and each foldable structure comprises two planes parallel to a bending axis of the flexible display device;
wherein the end component further comprises a partition, both ends of which are connected to the first back plate and the second back plate respectively;
the at least one foldable structure comprises a plurality of V-shaped structural layers, each V-shaped structural layer comprises a plurality of V-shaped units, an opening of each V-shaped unit faces the first back plate or the second back plate;
one end of the V-shaped unit is connected to an end surface of the arch component, and the other end of the V-shaped unit is connected to a surface of the partition adjacent to the arch component;
the plurality of V-shaped structural layers are arranged in layers on the surface of the partition adjacent to the arch component, and V-shaped units in two adjacent V-shaped structural layers are alternately arranged; and
a display panel, disposed on one side of the concave surface of the back plate structure.

14. The flexible display device according to claim 13, wherein a vertical distance between the end component of the back plate structure and an end of the display panel is between 0.5 mm and 1 mm.

* * * * *